United States Patent [19]

Kawaguchi et al.

[11] Patent Number: 5,354,710
[45] Date of Patent: Oct. 11, 1994

[54] METHOD OF MANUFACTURING SEMICONDUCTOR DEVICES USING AN ADSORPTION ENHANCEMENT LAYER

[75] Inventors: Hideichi Kawaguchi; Yoshitaka Tsunashima; Kikuo Yamabe; Katsuya Okumura, all of Kanagawa, Japan

[73] Assignee: Kabushiki Kaisha Toshiba, Kawasaki, Japan

[21] Appl. No.: 17,449

[22] Filed: Feb. 12, 1993

Related U.S. Application Data

[63] Continuation of Ser. No. 664,437, Mar. 4, 1991, abandoned, which is a continuation of Ser. No. 428,446, Oct. 30, 1989, abandoned, which is a continuation of Ser. No. 296,697, Jan. 13, 1989, abandoned.

[30] Foreign Application Priority Data

Jan. 14, 1988 [JP] Japan .................... 63-4883

[51] Int. Cl.⁵ ............. H01L 21/00; H01L 21/02; H01L 21/225; H01L 21/385
[52] U.S. Cl. .................. 430/161; 437/162
[58] Field of Search ............ 437/160, 161, 162

[56] References Cited

U.S. PATENT DOCUMENTS

| | | | |
|---|---|---|---|
| 4,549,914 | 10/1985 | Oh | 437/149 |
| 4,554,728 | 11/1985 | Shepard | 437/67 |
| 4,666,556 | 5/1987 | Fulton et al. | 437/162 |
| 4,666,557 | 5/1987 | Collins et al. | 437/67 |
| 4,676,847 | 6/1987 | Lin | 437/67 |

FOREIGN PATENT DOCUMENTS

| | | | |
|---|---|---|---|
| 0148825 | 11/1981 | Japan | 437/162 |
| 0028332 | 2/1984 | Japan | 437/168 |
| 0151422 | 8/1984 | Japan | 148/DIG. 35 |
| 0189730 | 8/1984 | Japan | 437/161 |
| 0171722 | 9/1985 | Japan | . |
| 0159741 | 7/1986 | Japan | 437/162 |
| 0208829 | 9/1986 | Japan | 437/162 |
| 0225851 | 10/1986 | Japan | 437/162 |
| 8504760 | 10/1985 | World Int. Prop. O. | 148/DIG. 31 |
| 8704006 | 7/1987 | World Int. Prop. O. | 437/168 |

OTHER PUBLICATIONS

Arienzo, M., In Situ Arsenic-Doped Polysilicon for VLSI Applications, IEEE Trans. Electron Devices, vol. ED-33, No. 10, Oct. 1986.

Shandhi, S., VLSI Fabrication Principles, Chap. 7, pp. 372-373, Wiley & Sons, 1983.

Extended Abstracts of the 19th Conference on Solid State Devices and Materials, Tokyo, 1987, pp. 319-322, Plasma Doping into the Sidewalls of Sub −0.5 um Width Trench.

*Primary Examiner*—R. Bruce Breneman
*Assistant Examiner*—B. Everhart
*Attorney, Agent, or Firm*—Oblon, Spivak, McClelland, Maier & Neustadt

[57] ABSTRACT

A method of manufacturing semiconductor devices comprises the steps of preparing a semiconductor substrate having a surface and a natural oxide film on the surface, forming an adsorption enhancement layer on the surface of the semiconductor substrate, forming an impurity adsorption layer containing impurities on the adsorption enhancement layer, and thermally diffusing the impurities through the adsorption enhancement layer and the natural oxide film into the substrate.

9 Claims, 5 Drawing Sheets

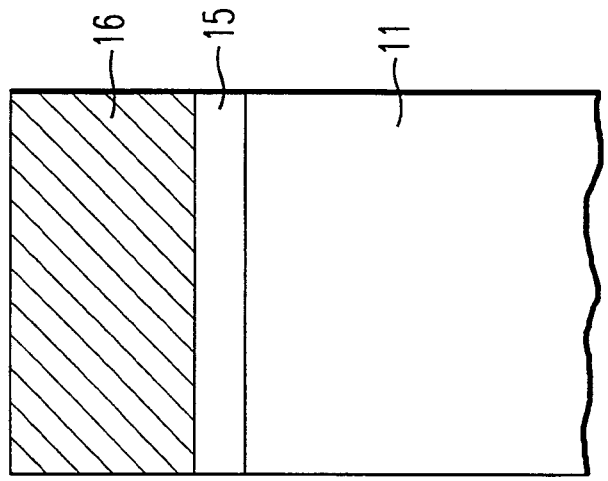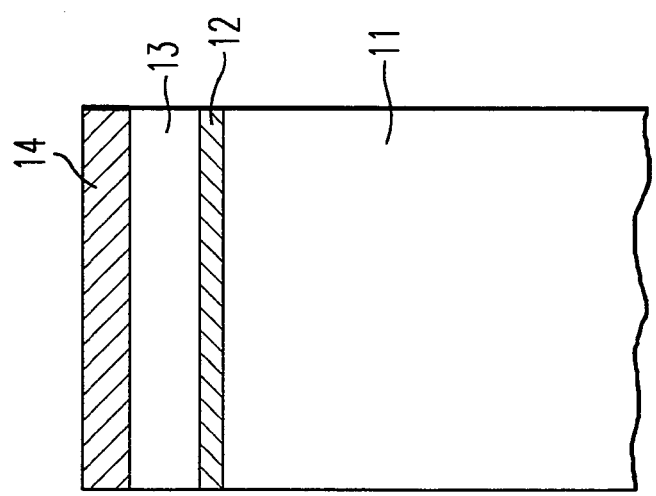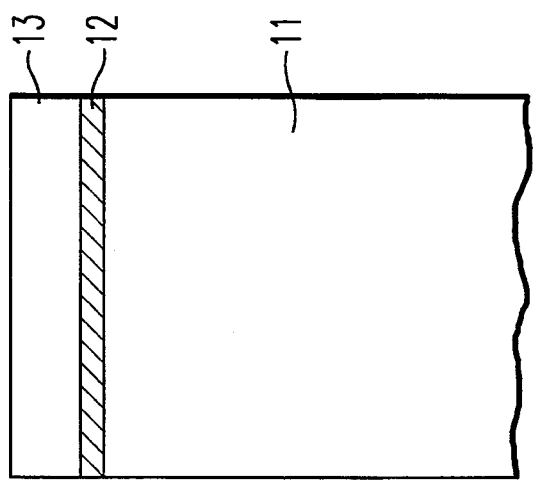

METHOD OF MANUFACTURING SEMICONDUCTOR DEVICES USING AN ADSORPTION ENHANCEMENT LAYER

This application is a continuation of application Ser. No. 07/664,437,filed on Mar. 4, 1991, now abandoned which is a continuation of Ser. No. 07/428,446, filed on Oct. 30, 1989, now abandoned, which is a continuation of Ser. No. 07/296,697, filed on Jan. 13, 1989, now abandoned.

BACKGROUND OF THE INVENTION

1. Field of the Invention

This invention relates to a method of manufacturing semiconductor devices, and more particularly to an improved method of manufacturing semiconductor devices in which impurity conductive layers are formed on the surface of a semiconductor substrate.

2. Description of the Prior Art

In recent years, the constituent components of semiconductor integrated circuits such as DRAMs (dynamic random access memory) have been significantly reduced in size to meet higher integration requirements. In general, DRAMs use memory cells each of which is constituted on the basis of one-transistor/one-capacitor. Thus, the further reduction in the size of the memory cell is very important to achieve higher-integration. When reducing the size of the memory cell, the following must be taken into consideration. Specifically, when a cell capacitor, which is a constituent component of the memory cell, is reduced in size, the amount of electric charge stored therein also decreases. This causes the cell capacitor to operate erroneously in response to noise. Namely, a S/N ratio (signal-to-noise ratio) having a sufficient read-out margin cannot be secured. Thus, the cell capacitor must store a sufficient amount of electric charge to avoid such an erroneous operation. A technique is known in which the thickness of the insulating film of the cell capacitor is reduced to secure a prescribed amount of electric charge. However, this technique has reached the limit in reliability with respect to the electric field strength. Instead of this technique, a trench-capacitor technique in which an effective surface area of the cell capacitor can be obtained to secure a prescribed amount of electric charge, advantageously is employed. Specifically, as shown in FIG. 6a, trench capacitor cells are constituted by plural trenches 65 formed on the surface of a P-type silicon substrate 61, a capacitor oxide film 62, an N-type impurity-doped polycrystalline silicon layer 63 and an N-type impurity diffusion layer 64.

In FIG. 6a, the impurity diffusion layer 64 having a high concentration is formed outside the trenches 65 in the substrate 61. In this structure, depletion layers often do not develop on both sides of the trenches 65. Thus, the capacitors also may be operated at voltages of ½ Vcc in positive and negative polarities. As a result, the breakdown voltage of the capacitor insulating films is reduced. In this case, a technique to diffuse impurities very precisely into narrow and deep trenches is very important.

In this doping technique, ion implantation is widely used to form a diffusion layer because very precise amounts of impurity can be introduced. However, when ion implantation is applied to a trench structure, the following problem arises. Specifically, impurity ion implantation is intercepted by the vertical sidewalls of trenches 65 as shown in FIG. 6a. This is because the direction of impurity ion implantation is constant. Thus, regions where impurities are not introduced are developed. To solve this problem, several techniques can be considered. For example, the incident angle of implantation may be changed, or the silicon substrate may be rotated. However, both techniques are very difficult to apply to a trench structure which is expected to be used in the future of higher integration. Namely, the future trench will become even narrower and deeper.

In place of ion implantation, a technique in which impurity diffusion from a solid-phase diffusion source is utilized, can be considered. Specifically, as shown in FIG. 6b, an impurity-doped polycrystalline silicon film 63 or a silicon oxide film is formed within the trench 65 as a solid-phase diffusion source. Thereafter, impurities are introduced from the solid-phase diffusion source into the portions outside the trench 65 by use of thermal diffusion. In this case, a homogeneous film having a prescribed impurity concentration must be uniformly formed on the inner wall of the trenches 45 as an impurity diffusion source. However, trenches are becoming narrower and deeper with the progress of integration. Thus, formation of a uniform impurity diffusion source will become more difficult. Several techniques have been considered to meet such requirements.

For example, in the case of the CVD (chemical vapor deposition) technique, an impurity diffusion source cannot be uniformly formed inside the trench. Specifically, the film of the impurity diffusion source becomes thinner toward the bottom portion of the trench. This thinned film causes an insufficient amount of impurity diffusion. As a result, the concentrations of the impurity diffusion layer 64 become nonuniform with respect to the upper and bottom portions of the trench 65. In another technique, a solution containing impurities is painted on the inner sidewalls and bottom of the trench. The solution drys so as to form an impurity diffusion source. This technique has disadvantages such that bubbles in the solution can remain within the trench. Further, when the trench becomes narrower and deeper, it is more difficult to completely introduce the solution into the entire portions within a large number of trenches (more than one million trenches per chip, for example).

As described above, in the conventional techniques, it is very difficult to introduce precise amounts of impurity into a semiconductor substrate having a significant unevenness on the surface structure thereof.

Another technique can be considered to solve this problem. In this technique, impurity elements or compounds containing impurity elements are obtained by a thermal decomposition reaction from vapor-state impurity elements or compounds containing impurity elements. Then, these materials are adsorbed to the inside of trenches and serve as an impurity diffusion source. This technique can form an impurity diffusion layer having a uniform concentration on the entire portions within the trenches. However, a natural oxide film is formed spontaneously on the surface of a semiconductor substrate. Moreover, such a natural film grows rapidly in the air, and the elimination thereof is difficult. Further, the natural oxide film obstructs the adsorption of conductive-layer forming elements or compounds containing one of these elements. As a result, impurities cannot be sufficiently diffused into the substrate.

SUMMARY OF THE INVENTION

Accordingly, one object of the present invention is to provide an improved method of manufacturing semiconductor devices in which a sufficient amount of impurity can be diffused into the substrate when using a technique in which vapor-state impurity elements or compounds containing impurity elements are utilized.

Briefly, in accordance with the present invention, there is provided a method of manufacturing semiconductor devices which comprises the steps of preparing a semiconductor substrate having an oxide film naturally formed on the surface thereof, forming a semiconductor layer on the surface of the semiconductor substrate, forming an impurity layer containing impurities on the semiconductor layer, and diffusing thermally the impurities on the surface of the semiconductor substrate under the natural oxide film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1a through 1c are cross-sectional views illustrating manufacturing processes according to a first embodiment of the present invention;

FIG. 4a is a cross-sectional view and FIG. 4b is a plan view;

FIG. 6a is a cross-sectional view illustrating a semiconductor device, FIG. 6b is a partial plan view of the semiconductor device shown in FIG. 6a, and FIG. 6c is a graph illustrating the differences in the characteristics of the semiconductor devices manufactured by the conventional method and the method of present invention.

DESCRIPTION OF THE PREFERRED EMBODIMENTS

Figure 2D:
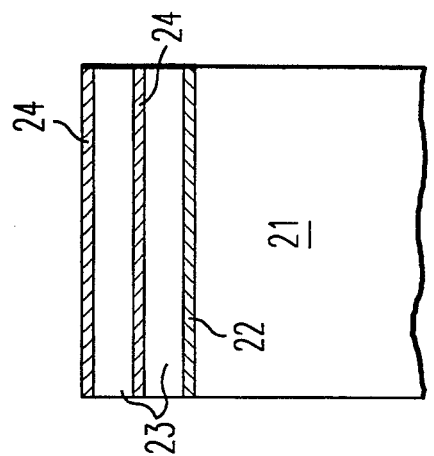
FIGS. 2a through 2d are cross-sectional views illustrating manufacturing processes according to a second embodiment of the present invention.
Figure 2C:
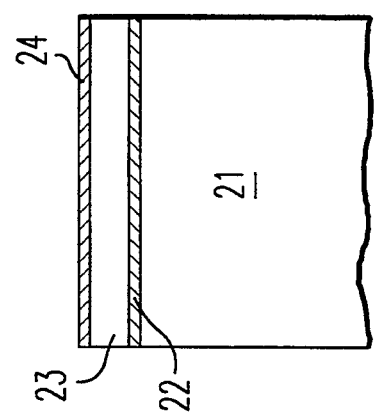
Figure 2B:
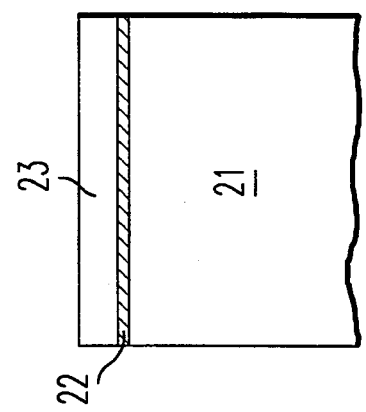
Figure 2A:
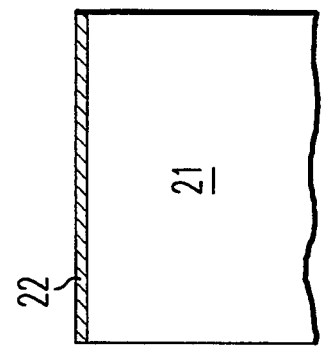

Referring now to the drawings, wherein like reference numerals designate identical or corresponding parts throughout the several views, and more particularly to FIG. 1 thereof, one embodiment of this invention will be described.

In FIG. 1a, a P-type silicon substrate 11 of the (100)-surface having a specific resistance of 9 to 11 $\Omega$cm is prepared. A large number of trenches (not shown) for use in forming cell capacitors of the DRAM (dynamic random access memory) are provided on the surface of substrate 11. Foreign substances such as organic substances attached to the surface of substrate 11 are removed by cleansing with a water solution mixed with sulfuric acid and hydrogen peroxide. Subsequently, the surface of substrate 11 is processed with a solution of dilute hydrofluoric acid. Thereafter, an adsorption enhancement layer 13 made of polycrystalline silicon of about 50 Å thick is deposited by use of CVD (chemical vapor deposition). This process is performed within a CVD apparatus by using silane ($SiH_4$) gas of 100% concentration at a temperature of about 780° C. under a pressure of 1 Tort as the material gas. A natural oxide film 12 is formed on the surface of substrate 11. In FIG. 1b, phosphine ($PH_3$) gas of 1% concentration diluted with helium is reacted with the P-type silicon substrate 11. Then, phosphorus is adsorbed into the surface of the adsorption enhancement layer 13 to form a phosphorus-adsorbed layer 14.

Subsequently, the substrate 11 is continuously held within the CVD apparatus. In the CVD apparatus, the substrate 11 is exposed to an atmosphere of oxygen of 10% concentration diluted with nitrogen at about 1000° C. for about 1 hour. Then, the substrate 11 is thermally processed therein so as to diffuse the phosphorus. As a result, an N-type conductive layer 15 is formed on the surface of the substrate 11, as shown in FIG. 1c. Specifically, the phosphorus-diffusion process causes the N-type conductive layer 15 to penetrate the polycrystalline silicon layer 13 and the natural oxide film 12 and to reach the portions within the silicon substrate 11. Thereafter, an oxide film 16 is formed on the N-type conductive layer 15.

In the above-described embodiment, the temperature at which phosphorus is adsorbed on the adsorption enhancement layer 13 is determined to be about 780° C. However, the optimum temperature for phosphorus adsorption is in the range of about 500° C. to 500° C. Further, if such temperature is set at about 400° C., phosphine ($PH_3$) gas is adsorbed on the adsorption enhancement layer 13. In this case, a phosphine-doped layer may also be used as a diffusion source.

The amount of phosphorus was actually measured by use of a sheet resistance measuring technique. This technique is to measure the sheet resistance value on the surface of a diffusion layer. Then, the amount of impurities therein is obtained on the basis of specified calculations using the measured sheet resistance value.

As is well known, the sheet resistance is measured in units of ohms. However, it is conventionally specified in units of ohms per square ($\Omega/\square$). The sheet resistance of an N-type conductive layer manufactured by the conventional process is about 1K $\Omega/\square$. In contrast to this, the sheet resistance of the N-type conductive layer 15 in this embodiment is reduced by about one half to about 500 $\Omega/\square$. In the conventional process, a polycrystalline silicon layer is not deposited before phosphorus adsorption. However, in this embodiment, a polycrystalline silicon layer is deposited before phosphorus adsorption. As seen from the above, the phosphorus adsorption efficiency in this embodiment can be significantly enhanced.

Figure 3:
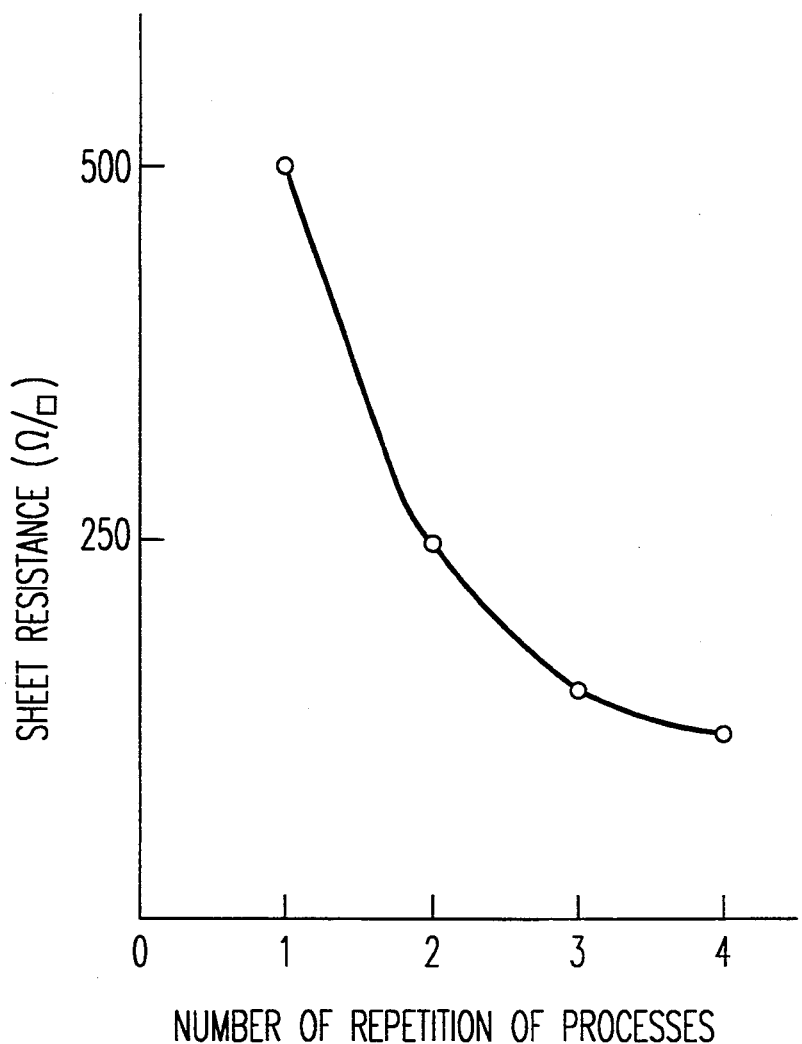
FIG. 3 is a Graph illustrating characteristics for explaining advantages of the second embodiment according to the present invention.

Next, a second embodiment of the present invention will be described. In the second embodiment, the deposition of an adsorption enhancement layer of polycrystalline silicon and the introduction of phosphine ($PH_3$) gas are repeated. The inventors discovered the following facts. As the number of repetitions of such processes increases, the sheet resistance value decreases, as shown in FIG. 3. The decrease of the sheet resistance value indicates an increase of the amount of phosphorus adsorbed.

Specifically, as shown in FIG. 2, a polycrystalline silicon layer 23 and a phosphorus-adsorbed layer 24 are alternately deposited on the natural oxide film 22 spontaneously formed on a silicon substrate 21.

Figure 4A:
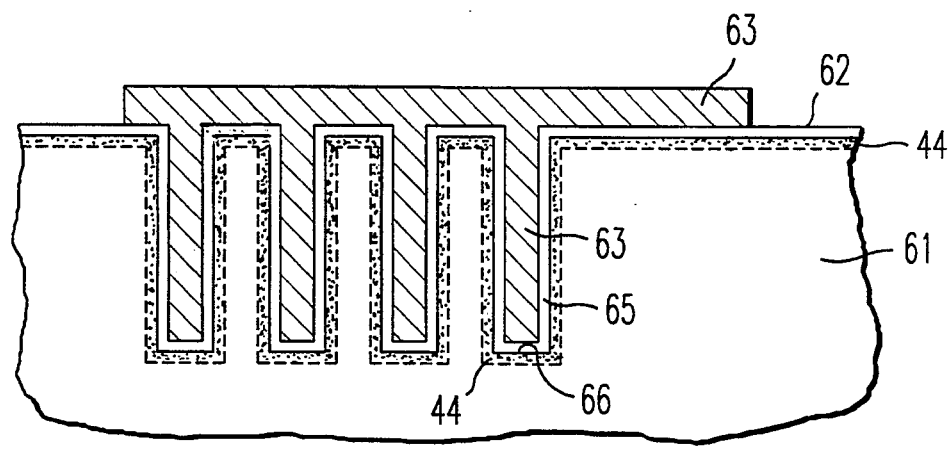
FIGS. 4a and 4b are diagrams illustrating MOS capacitors formed by using the processes of a second embodiment according to the present invention.
Figure 4B:
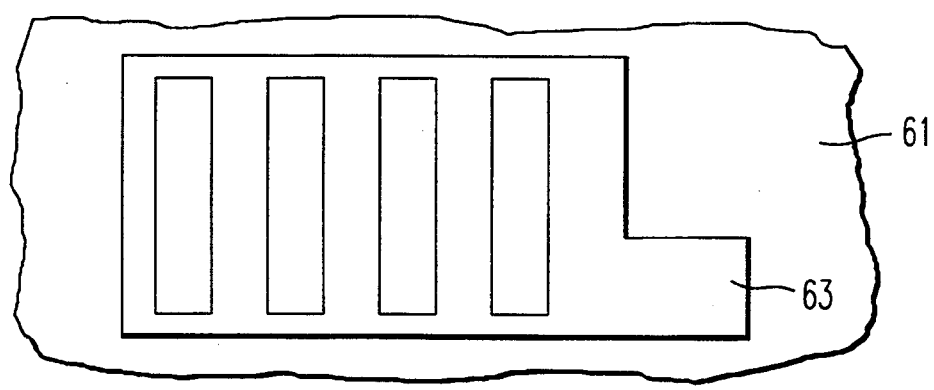

A MOS capacitor formed by the processes in the second embodiment according to the present invention will be described with reference to FIGS. 4a and 4b. In FIGS. 4a and 4b, the reference numerals are the same as those in FIGS. 6a and 6b for the sake of comparison. In FIG. 4a, the portion 44 surrounded with the dotted line is an impurity layer formed by the processes in the second embodiment.

Figure 6A:
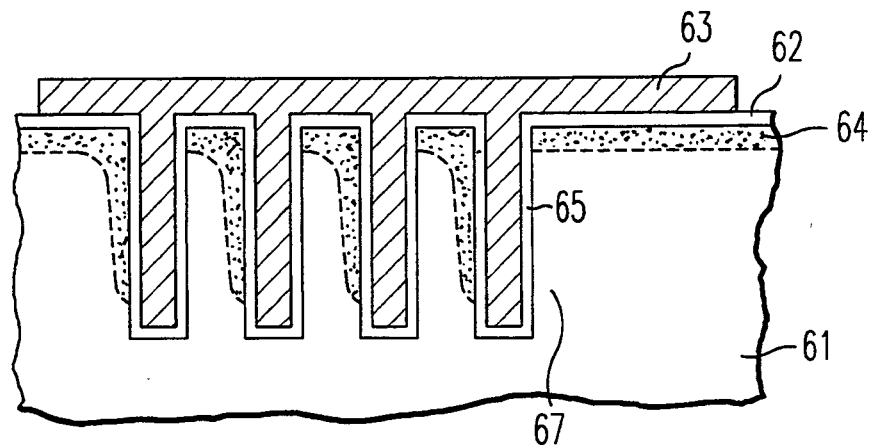
FIGS. 6a through 6c are diagrams for explaining the conventional method.
Figure 6B:
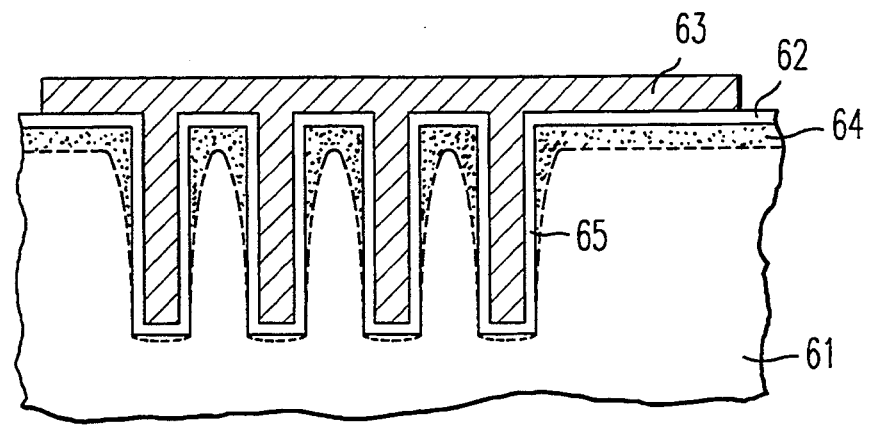
Figure 6C:
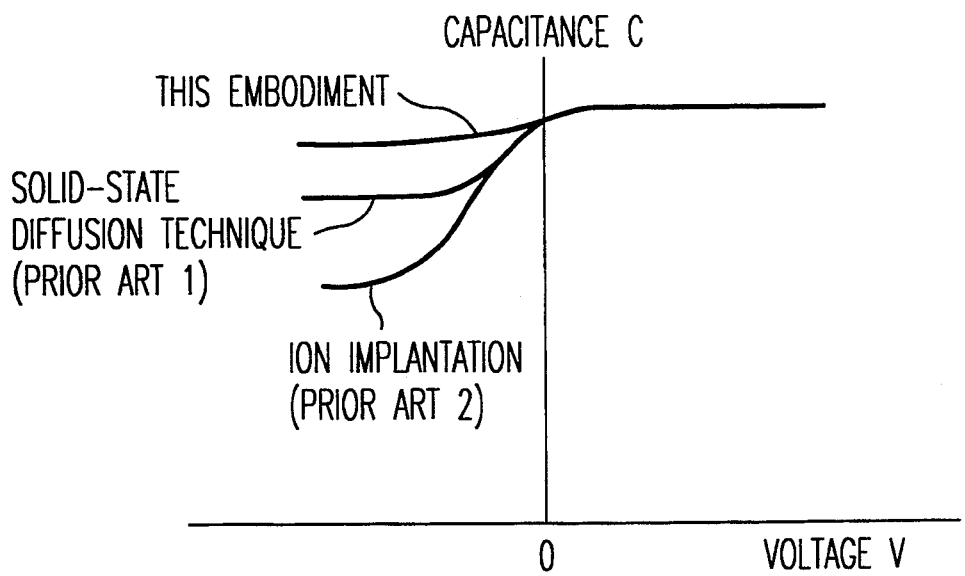

FIG. 6c is a graph illustrating C-V (capacitance-voltage) characteristics of MOS capacitors manufactured, respectively, by the conventional processes and the processes of this embodiment, for the sake of comparison. In FIG. 6c, three different curves represent the respective C-V characteristics of the MOS capacitors. All of the MOS capacitors are formed using trenches substantially the same as those shown in FIG. 6a. However, each MOS capacitor is formed by three different processes such as ion implantation (Prior Art 2), a solid-phase diffusion technique (Prior Art 1), and the processes in this embodiment. In the cases of the Prior Art techniques 1 and 2, the impurities are not uniformly introduced on both sides of the trenches in the substrate (FIGS. 6a and 6b). The portions into which the impurities are not introduced become depletion regions. Thus, the capacitance available is insufficient. However, in the case of this embodiment, the impurities are introduduced uniformly into the entire portions on both sides outside the trenches in the substrate, as shown in FIG. 4a. As a result, the prescribed capacitance can be securely obtained in both polarities.

In this embodiment, the descriptions have been made as to the processes of manufacturing MOS capacitors. However, this invention is not limited to this, but may also be applied to the process of introducing impurities into other semiconductor substrates having trenches which are required to become narrower and deeper.

As described above, in this embodiment, a natural oxide film spontaneously formed on the surface of the semiconductor substrate is eliminated by a prescribed diffusion process. Thereafter, conductive-layer forming elements or compounds containing one of these elements are adsorbed to the surface with no natural oxide film. Therefore, impurity adsorption efficiency is significantly enhanced.

Moreover, in accordance with the present invention, an impurity layer having a uniform thickness can be formed on the surface of a silicon substrate provided with a large number of trenches. The impurity layer can provide the silicon substrate with prescribed conductive regions suitable for higher-integration processes. Therefore, impurities can be sufficiently diffused into the trenches when the trenches become narrower and deeper. This is significantly advantageous to the general trend of continuous reduction in the size of component regions, causing the aspect ratio of trenches to increased.

Next, a third embodiment of the present invention will be described. In the above-described embodiments, a phosphorus-doped layer is used as an impurity diffusion source. However, in this embodiment, diborane ($B_2H_6$) is used as gas in place of phosphine, so as to form MOS capacitors. Specifically, the diborane diluted with argon is used as the gas so as to adsorb an impurity on an adsorption enhancement layer. Thermal diffusion was performed in an atmosphere of nitrogen gas alone at 1000° C. for 30 minutes. Other conditions are the same as those in the second embodiment. After the diffusion, the amount of boron diffused in a conducting layer was evaluated by the sheet resistance measuring technique. The result was 169 $\Omega/\square$. In contrast to this, the sheet resistance value in the conventional conducting layer without an adsorption enhancement layer of polycrystalline silicon was 1.8 k$\Omega/\square$. As a result, it was confirmed that the technique of diffusion using the adsorption enhancement layer according to the present invention can achieve a significantly high boron-adsorption efficiency.

Figure 5:
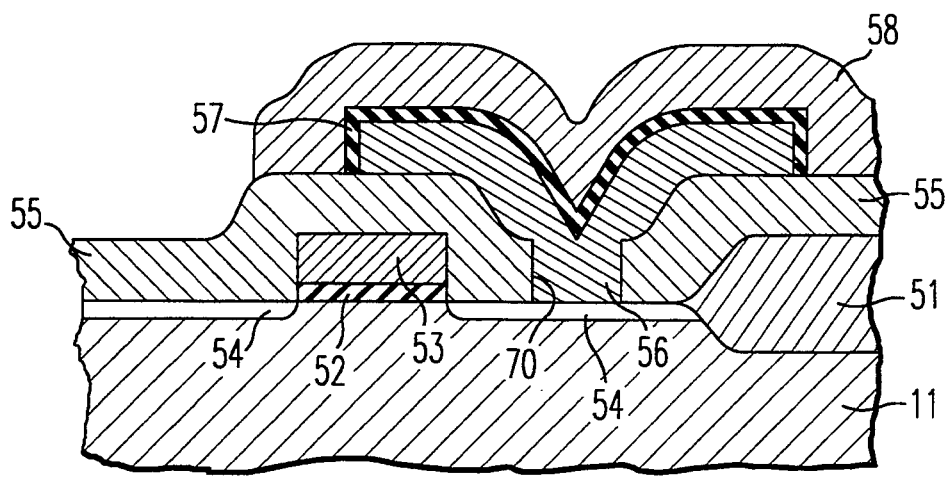
FIG. 5 is a cross-sectional view illustrating a third embodiment according to the present invention.

FIG. 5 is a cross-sectional view illustrating a memory cell with stacked capacitors manufactured by the processes of the third embodiment according to the present invention. In FIG. 5, a field insulating film 51 made of $SiO_2$ is formed on a P-type silicon substrate 11. A gate oxide film 52 and a gate electrode 53 are deposited on the silicon substrate 11. Further, N-type source and drain regions 54 are formed on the substrate 11. The gate electrode 53 and the N-type source and drain regions 54 constitute a FET (field-effect transistor). A layer-insulating film 55 made of $SiO_2$ is formed on the FET and the field insulating film 51 by use of a CVD (chemical vapor deposition) technique. An opening 70 is formed in a portion of the layer-insulating film 55 on the N-type regions 54. A lower electrode 56 made of polycrystalline silicon is formed within the opening 70. The lower electrode 56 spreads over the layer-insulating film 55 connected to the N-type regions 54. An N-type impurity is doped into the polycrystalline silicon that constitutes the lower electrode 56 by use of the same technique as that in the first embodiment according to the present invention.

The lower electrode 56 is formed by the following processes. First, a polycrystalline silicon layer is deposited on the entire surface of the layer-insulating film 55 formed on the substrate 11. Thereafter, a photoresist mask having prescribed patterns is formed on the thus deposited polycrystalline silicon layer. The polycrystalline silicon layer is then etched through the mask so as to form the lower electrode 56. Next, the substrate 11 is introduced into a cleansing apparatus so as to be cleansed. In the cleansing apparatus, organic impurities attached to the substrate surface during the patterning or etching are eliminated. Plural times of cleansing processes with different cleansing agents are performed as required.

The substrate 11 is moved from the cleansing apparatus into a CVD apparatus. At this stage, the substrate 11 is exposed to air. Thus, a natural oxide film is spontaneously formed on the surface of the lower electrode 56 made of polycrystalline silicon. Next, a thin polycrystalline silicon layer is formed on the entire surface of the lower electrode 56 regardless of the natural oxide film. Thereafter, an impurity is adsorbed on the thin polycrystalline silicon layer. The impurity is then thermally diffused through the thin polycrystalline silicon layer into the polycrystalline silicon layer formed previously to form a lower electrode 56. As a result, the lower electrode 56 is completed.

Next, a capacitor insulating film 57 made of $SiO_2$ is formed on the surface of the lower electrode 56. Thereafter, an upper electrode 58 is formed on the capacitor insulating film 57. An impurity is implanted into the upper electrode 58 in the same way as that in the above-described embodiments. The stacked capacitor electrode structure having an uneven surface, as shown in FIG. 5, can also be processed to achieve a uniform distribution and high concentration of the impurity within the lower electrode. As a result, a memory cell with a stacked capacitor structure having the same advantages as those in the first embodiment can be securely obtained.

Here, thermal reaction of material compound gas is used as an advantageous technique to form the polycrystalline silicon layer 13 on the natural oxide film 12 and to adsorb impurities into the surface of silicon layer 13. However, other techniques such as a photochemical reaction, electron cyclotron resonance (ECR), magnetron-plasma reaction and the like may also be used.

Further, an element such as arsenic (As), phosphorus (P) or antimony (Sb), or a compound containing one of these elements is used as an impurity material. As described above, the impurity material is adsorbed into the surface of silicon layer 13 so as to form the N-type conducting layer 15 on the surface of the substrate 11. If a P-type conducting layer is required to be formed on the silicon substrate 11, an element such as boron (B) or gallium (Ga), or a compound containing one of these elements is used as an impurity material.

In the above-described embodiments, a semiconductor such as polycrystalline silicon is used as a material of an adsorption enhancement layer. However, non-crystalline silicon and other semiconductors such as germanium may also be used as a material of an adsorption enhancement layer. In all cases, the substrate by itself may be made of silicon. Further, the adsorption enhancement layer is not limited to a semiconductor, but an insulating film such as an $SiO_2$ film may also be used, as far as necessary impurities can be easily adsorbed. In any case, it is required that the surface of the insulating film be given an activation process by sputtering in an atmosphere of argon (At) gas. As a result, the impurity can be satisfactorily adsorbed on the surface of the insulating film. An adsorption enhancement layer is required to be as thin as possible so that an impurity can easily penetrate therethrough. An adsorption enhancement is also required to be as uniform as possible so that a diffusion layer having an uniform impurity concentration can be formed.

Moreover, the adsorption, which has been used in the above-described embodiments according to the present invention, is defined as a state such as follows. Specifically, a compound which serves as an impurity is deposited on a specified layer in such a manner that a uniform thickness of about one atom or a few atoms is formed thereon. The compound, i.e., impurity, is chemically combined with the surface of the specified layer, which in turn becomes an adsorption enhancement layer. The thickness of one atom is most preferable because the most uniform thickness can be easily obtained thereby.

Obviously, numerous additional modifications and variations of the present invention are possible in light of the above teachings. It is therefore to be understood that within the scope of the appended claims, the invention may be practiced otherwise than as specifically described herein.

What is claimed is:

1. A method of manufacturing semiconductor devices comprising the steps of:
    preparing a substrate having a semiconductor surface portion including a plurality of trenches, the substrate having a spontaneous natural oxide film formed on the trenches of the semiconductor surface portion;
    forming an adsorption enhancement layer consisting essentially of a semiconductor material and having a thickness of one atom layer to less than 50 Å on the natural oxide film formed on the surface of said semiconductor substrate;
    adsorbing impurities on the surface of adsorption enhancement layer; and
    thermally diffusing said impurities into the surface portion of the semiconductor substrate through said adsorption enhancement layer and the natural oxide film.

2. The method of claim 1, wherein the step of preparing the substrate and the step of forming the adsorption enhancement layer both include a step of selecting a material containing silicon.

3. The method of claim 1, wherein the step of thermally diffusing includes the step of heating to a temperature above 800° C.

4. The method of claim 1, wherein the step of forming the adsorption enhancement layer includes the step of depositing polycrystalline silicon on the substrate.

5. The method of claim 1, wherein the step of forming the adsorption enhancement layer includes the step of reacting a compound gas containing semiconductor elements with the substrate.

6. The method of claim 1, wherein the step of adsorbing an impurity layer includes the step of reacting a compound gas containing impurity elements with the enhancement layer.

7. The method of claim 1, wherein the step of forming the adsorption enhancement layer includes the step of exposing said adsorption enhancement layer to a non-oxidizing atmosphere.

8. A method of manufacturing semiconductor devices, comprising the steps of:
    preparing a substrate having a semiconductor surface portion including a plurality of trenches, the substrate having a spontaneous natural oxide film formed on the semiconductor surface portion;
    forming a first adsorption enhancement layer consisting essentially of a semiconductor material and having a thickness of one atom layer to less than 50 Å on the natural oxide film on the surface of said semiconductor substrate;
    forming by adsorption a first impurities containing layer on the adsorption enhancement layer;
    forming a second adsorption enhancement layer consisting essentially of a second semiconductor material and having a thickness of one atom layer to less than 50 Å on said first impurities containing layer;
    adsorbing impurities on the surface of the second adsorption enhancement layer formed on said impurities-containing layer; and
    thermally diffusing the impurities adsorbed on said first and second adsorption enhancement layer into the surface portion of the semiconductor substrate through said first and second adsorption enhancement layer and said natural oxide film.

9. The method of claim 1, wherein the step of preparing the semiconductor substrate includes the step of forming a plurality of trenches on the surface of said semiconductor substrate.

* * * * *